United States Patent
Lee et al.

(10) Patent No.: US 8,035,237 B2
(45) Date of Patent: Oct. 11, 2011

(54) INTEGRATED CIRCUIT PACKAGE SYSTEM WITH HEAT SLUG

(75) Inventors: SeongMin Lee, Seoul (KR); Tae Keun Lee, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/398,163

(22) Filed: Mar. 4, 2009

(65) Prior Publication Data

US 2009/0174064 A1 Jul. 9, 2009

Related U.S. Application Data

(62) Division of application No. 11/163,559, filed on Oct. 22, 2005, now Pat. No. 7,517,729.

(60) Provisional application No. 60/627,937, filed on Nov. 13, 2004.

(51) Int. Cl.
*H01L 23/373* (2006.01)

(52) U.S. Cl. .................. 257/796; 257/717; 257/E23.11

(58) Field of Classification Search .................. 257/706, 257/707, 712, 713, 717, 723–725, 796, E23.11
See application file for complete search history.

(56) References Cited

U.S. PATENT DOCUMENTS

| | | | |
|---|---|---|---|
| 6,331,451 B1 | 12/2001 | Fusaro et al. | |
| 6,441,499 B1 * | 8/2002 | Nagarajan et al. | 257/780 |
| 6,918,178 B2 | 7/2005 | Chao et al. | |
| 6,933,176 B1 * | 8/2005 | Kirloskar et al. | 438/122 |
| 2003/0104656 A1 | 6/2003 | Ahmad | |
| 2003/0106212 A1 * | 6/2003 | Chao et al. | 29/848 |
| 2004/0195697 A1 | 10/2004 | Boon et al. | |

* cited by examiner

*Primary Examiner* — Marcos D. Pizarro
(74) *Attorney, Agent, or Firm* — Mikio Ishimaru

(57) ABSTRACT

An integrated circuit package system is provided including providing a substrate having a die attached and electrically bonded thereto. The system includes forming heat slug pillars on the substrate, positioning a heat slug on the heat slug pillars, and encapsulating the substrate, the die, the heat slug pillars, and the heat slug in a mold compound. The system includes singulating the substrate, the die, the heat slug, and the mold compound.

9 Claims, 5 Drawing Sheets

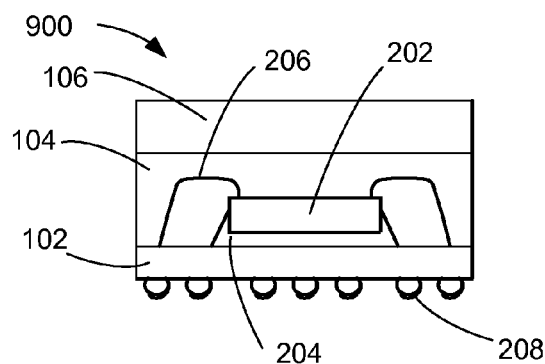
FIG. 9
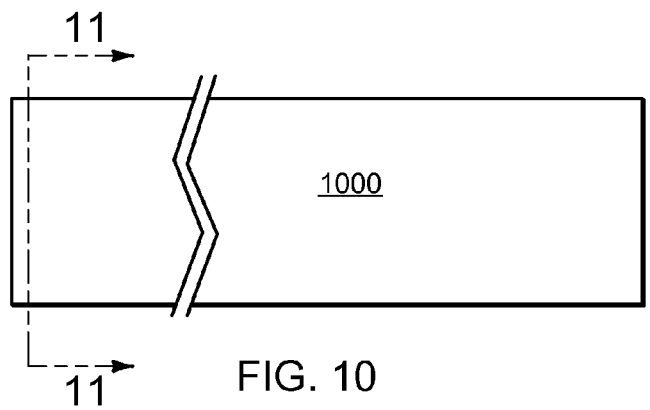
FIG. 10
FIG. 11
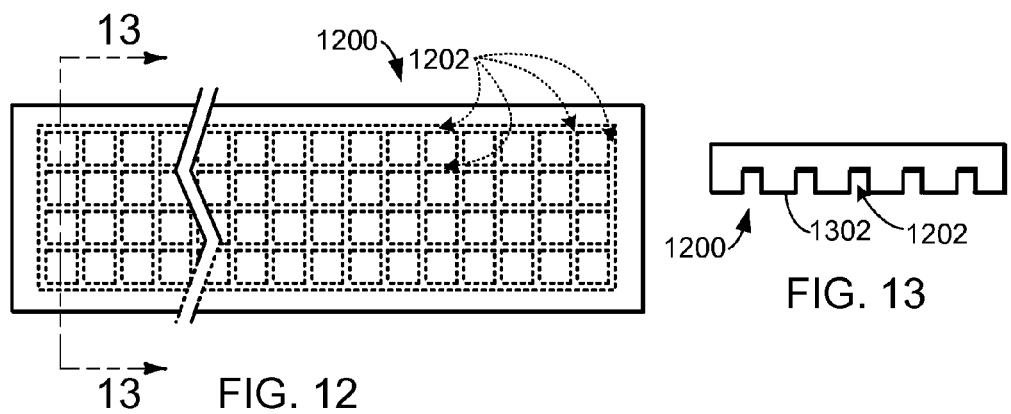
FIG. 12
FIG. 13

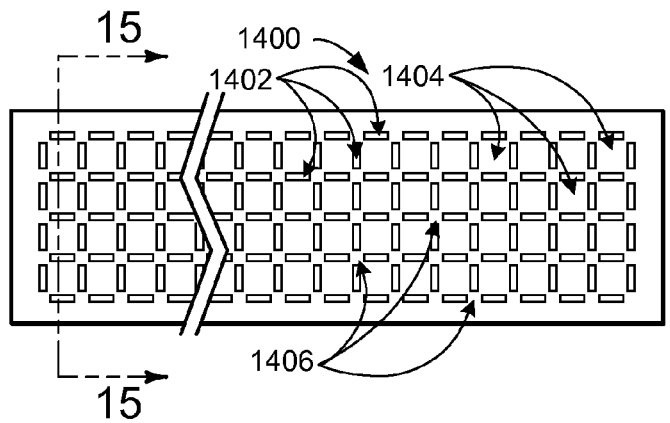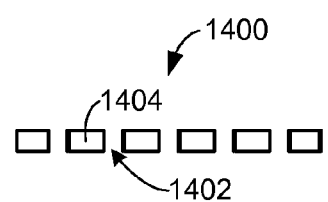
FIG. 14
FIG. 15
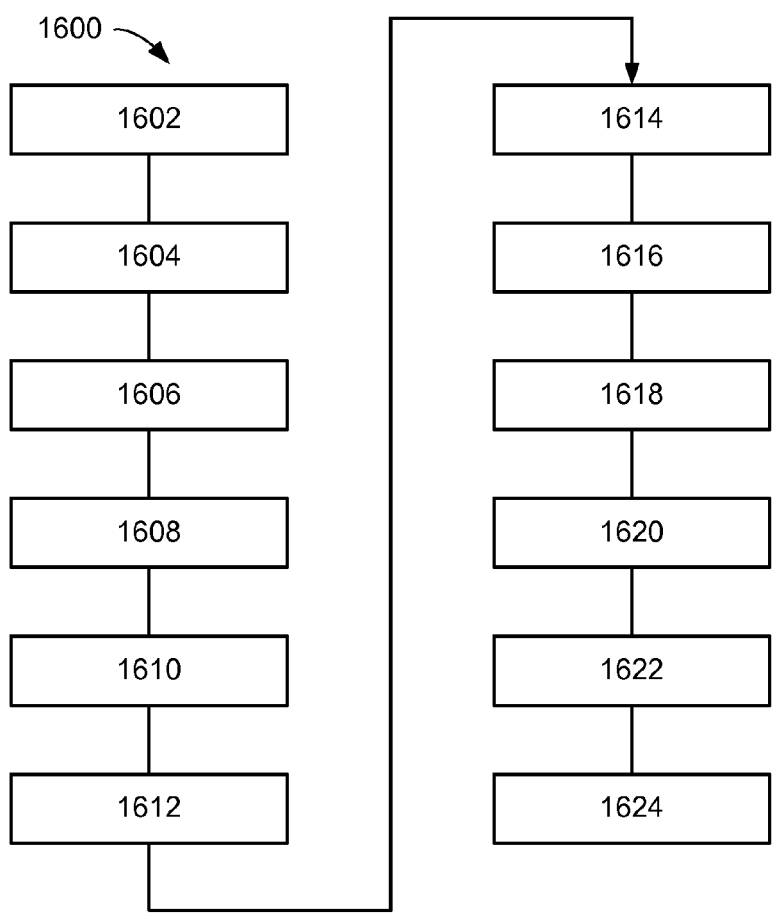
FIG. 16

INTEGRATED CIRCUIT PACKAGE SYSTEM WITH HEAT SLUG

CROSS-REFERENCE TO RELATED APPLICATION

This application is a divisional of U.S. Non-Provisional application Ser. No. 11/163,559 filed Oct. 22, 2005, now U.S. Pat. No. 7,517,729, which claims the benefit of U.S. Provisional Patent Application Ser. No. 60/627,937 filed Nov. 13, 2004, and the subject matter thereof is hereby incorporated herein by reference thereto.

TECHNICAL FIELD

The present invention relates generally to integrated circuit packages, and more particularly to integrated circuit packages with heat slugs.

BACKGROUND

In the electronics industry, a continuing objective is to further and further reduce the size of electronic devices while simultaneously increasing performance and speed. Cellular telephones, personal data devices, notebook computers, camcorders, and digital cameras are but a few of the consumer products that require and benefit from this ongoing miniaturization of sophisticated electronics.

Integrated circuit ("IC") assemblies for such complex electronic systems typically have a large number of interconnected IC dies (or "chips"). The IC dies are usually made from a semiconductor material such as silicon ("Si") or gallium arsenide ("GaAs"). Photolithographic techniques are used to form the various semiconductor devices in multiple layers on the IC dies.

After manufacture, the IC dies are typically incorporated into packages that may contain one or several such dies. The IC die is mounted on the surface of a substrate, for example, by means of a layer of epoxy. Bond wires can connect electrical contact points on the upper surface of the IC die to the substrate. Solder contact balls can also be provided on the lower surface of the IC die for additional connections between the IC die and the substrate. A molding compound, typically of molded plastic epoxy such as epoxy molding compound ("EMC"), encapsulates the die and the bond wires, providing environmental protection for the die and defining the semiconductor die package. These die packages or modules are then typically mounted on printed circuit wiring boards.

Due to the ever-decreasing size and ever-increasing density, performance, and speed of such IC dies, the power density (the heat output concentration from the dies) is continually increasing. This requires ever more elaborate designs for thermal management to keep the IC die temperatures within acceptable ranges. Otherwise, and due in part to the poor heat transfer properties of the EMC, the packages are subject to malfunction due to heat build up in the package.

The internal thermal resistance and the thermal performance of a semiconductor package are determined by a series of heat flow paths. By making high heat conductivity connections between the bottom of the die and the substrate within the semiconductor package, heat generated in the die can be transferred efficiently from the die to the substrate. Similarly, by making high heat conductivity connections between the bottom of the semiconductor package and the external substrate on which the semiconductor package is mounted, heat can be transferred efficiently from the substrate within the semiconductor package to the external substrate.

For designs where additional heat must be removed from the semiconductor die, the molding compound that encapsulates the die can be partially omitted from the upper surface of the die to partially expose this surface. The exposed semiconductor die surface can then be put in direct physical contact with a heat spreader that overlies the semiconductor die. To enhance the cooling performance, a layer of thermal grease or the like can be spread between the semiconductor die surface and the heat spreader to improve heat transfer to the heat spreader.

The heat spreader is typically formed so that it can also be attached to the underlying substrate, resulting in a mechanically strong package. Additionally (or alternatively), the heat spreader can be encapsulated in the molding compound that forms the semiconductor package, sometimes with the heat spreader exposed on the upper surface of the package for heat emission therefrom.

The heat thus flows first from the IC die to the body of the semiconductor module or package into which the IC die has been incorporated, and then to the heat spreader. Even though the semiconductor packages interfere with thermal emission from the IC dies, the packages are necessary to protect the IC dies from moisture and mechanical damage. Therefore, an increasingly important consideration in making small, high-speed, high-density devices is providing packages that are capable of adequately spreading the heat generated by the devices.

Consequently, there still remains a need for improved, more economical, more efficient, and more readily manufactured and assembled heat spreader systems, heat spreader packages, and package fabrication systems for use with semiconductor devices. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including providing a substrate having a die attached and electrically bonded thereto. The system includes forming heat slug pillars on the substrate, positioning a heat slug on the heat slug pillars, and encapsulating the substrate, the die, the heat slug pillars, and the heat slug in a mold compound. The system includes singulating the substrate, the die, the heat slug, and the mold compound.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 9 shows a singulated integrated circuit package system in accordance with the present invention;

FIG. 10 shows a flat heat slug in accordance with an embodiment of the present invention;

FIG. 11 shows a cross-sectional view of FIG. 10 taken along line 11-11;

FIG. 12 shows a half-etched heat slug in another embodiment of the present invention;

FIG. 13 shows the structure of FIG. 12 taken along line 13-13;

FIG. 14 shows a tie bar heat slug in accordance with a still further embodiment of the present invention;

FIG. 15 is shows a cross-sectional view of the structure of FIG. 14 taken along line 15-15;

FIG. 16 shows a flow chart of an integrated circuit package system for manufacturing a package system in accordance with a still further embodiment of the present invention.

DETAILED DESCRIPTION OF THE PREFERRED EMBODIMENTS

Figure 1:
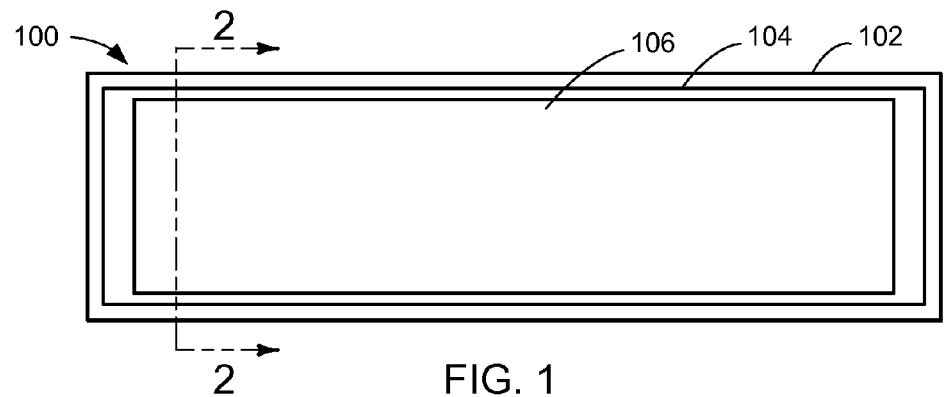
FIG. 1 shows a top view of a thermally enhanced integrated circuit (IC) package system in accordance with an embodiment of the present invention.

In the following description, numerous specific details are given to provide a thorough understanding of the invention. However, it will apparent that the invention may be practiced without these specific details. In order to avoid obscuring the present invention, some well-known system configurations and process steps are not disclosed in detail.

The term "horizontal" as used herein is defined as a plane parallel to the conventional plane or surface of the integrated circuit package substrate, regardless of its orientation. The term "vertical" refers to a direction perpendicular to the horizontal as just defined. Terms, such as "above", "below", "bottom", "top", "over", and "under", are defined with respect to the horizontal plane. The term "on" indicates that two elements are in direct contact.

Likewise, the drawings showing embodiments of the invention are semi-diagrammatic and not to scale and, particularly, some of the dimensions are for the clarity of presentation and are shown greatly exaggerated in the FIGs. In addition, where multiple embodiments are disclosed and described having some features in common, for clarity and ease of illustration and description thereof like features one to another will ordinarily be described with like reference numerals.

Referring now to FIG. 1, therein is shown a top view of a thermally enhanced integrated circuit (IC) package system 100 in accordance with an embodiment of the present invention. The system 100 includes a substrate 102 having a mold compound 104 topped by a heat slug 106.

Figure 2:
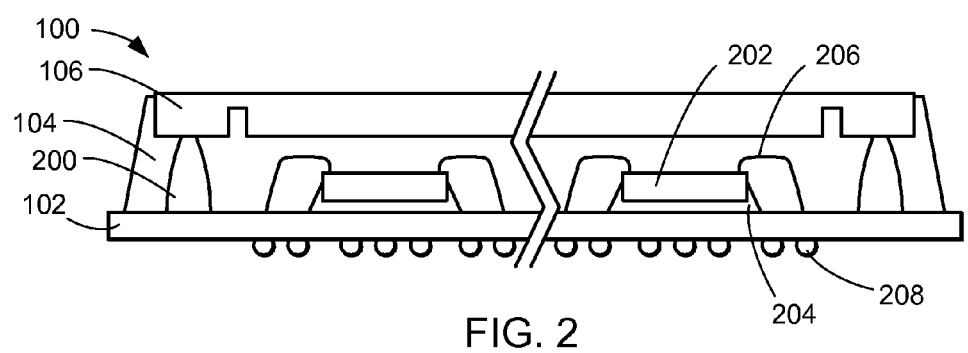
FIG. 2 shows a close-up view of the structure of FIG. 1 taken along line 2-2.

Referring now to FIG. 2, therein is shown a close-up view of the structure of FIG. 1 taken along line 2-2. The system 100 has heat slug support pillars 200 on the substrate 102 to support the heat slug 106 prior to encapsulation.

The heat slug pillars 200 are on the substrate 102 only around a periphery of a plurality of dies 202. Between the substrate 102 and the heat slug 106 are the dies 202 containing integrated circuits. The dies 202 are attached to the substrate 102 by die attach epoxy 204. The dies 202 are further electrically connected by wires 206 to the substrate 102, and by through vias and further wiring (not shown) to solder balls 208.

The heat slug support pillars 200 are of a material such as epoxy, eutectic ball materials, metal, and other materials, which preferably have elastic characteristics, a high aspect ratio formation, and adhesive characteristics. The elasticity is aimed at reducing mechanical stress when the heat slug 106 is pressed by the mold during molding of the mold compound 104. The high aspect ratio provides a thin pillar. The adhesive characteristics hold the heat slug 106 in place during the molding process.

The exposed area of the heat slug 106 after encapsulation is larger than a conventional heat slug when the encapsulation body size is the same.

Figure 3:
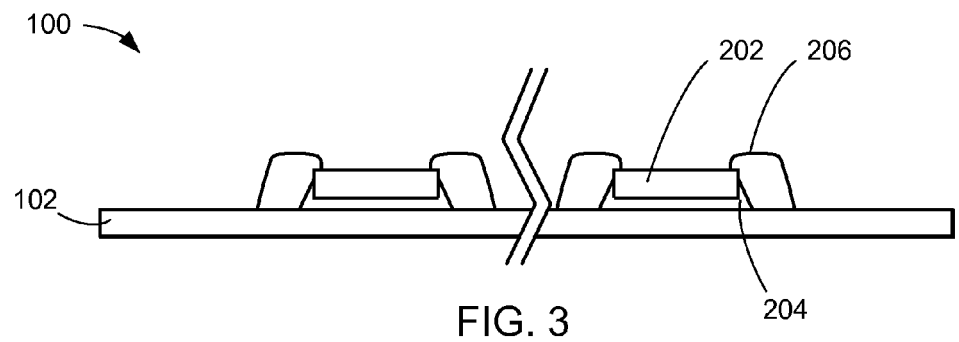
FIG. 3 shows the integrated circuit package system in an intermediate stage of manufacture.

Referring to FIG. 3, therein is shown the integrated circuit package system 100 in an intermediate stage of manufacture. The dies 202 are attached to the substrate 102 by the die attach adhesive 204 and wires 206 are wire bonded between the dies 202 and the substrate 102. It will be understood that the dies 202 can also be ball bonded, another electrical connection technique, to the substrate 102.

Figure 4:
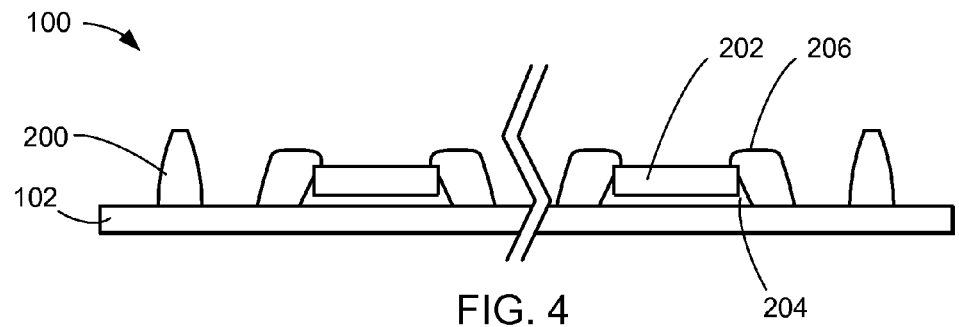
FIG. 4 shows the structure of FIG. 3 after forming heat slug support pillars.

Referring now to FIG. 4, therein is shown the structure of FIG. 3 after forming heat slug support pillars 200. The heat slug support pillars 200 can be deposited by a droplet building technique of dropping drops of adhesive on top of each other to the desired height. The heat slug support pillars 200 will form cones of adhesive around the outer perimeter of the integrated circuit package system 100 and will be sufficient in height to prevent contact between the wires 206 and the heat slug 106. The number of heat slug support pillars 200 will be determined heuristically by the number required to support the heat slug 106.

Figure 5:
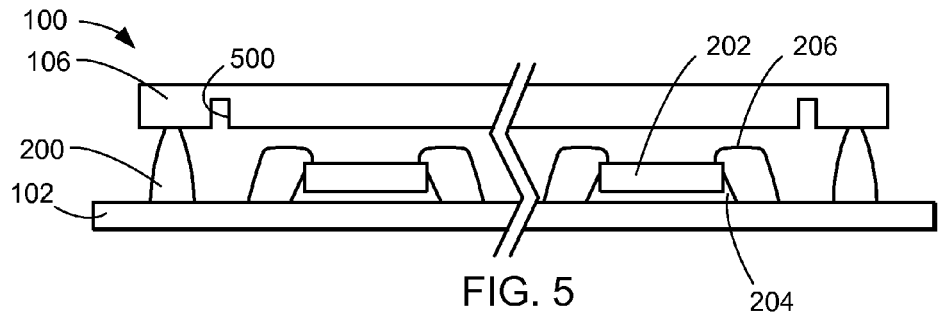
FIG. 5 shows the structure of FIG. 4 after positioning the heat slug.

Referring now to FIG. 5, therein is shown the structure of FIG. 4 after positioning the heat slug 106. The heat slug 106 is placed on the heat slug support pillars 200. The heat slug 106 has a groove 500 around its perimeter inside of the heat slug support pillars 200 and outside of the wires 206. The groove 500 is made as deep as possible without substantially affecting the rigidity of the heat slug 106 so that the singulation process at the edges will have to cut through as little of the heat slug 106 metal as possible.

Figure 6:
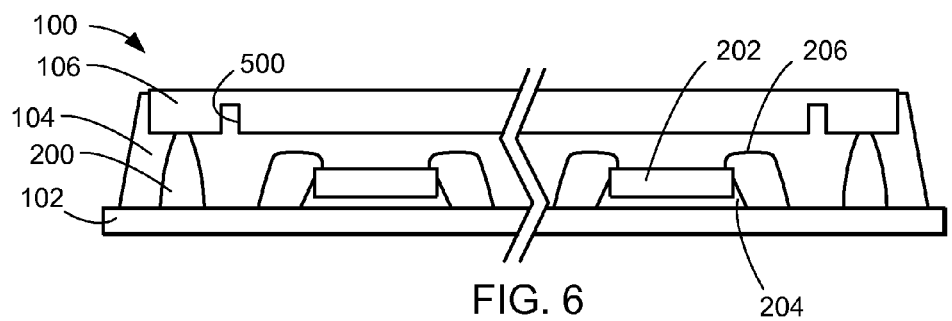
FIG. 6 shows the structure of FIG. 5 after encapsulation.

Referring now to FIG. 6, therein is shown the structure of FIG. 5 after encapsulation. A mold is placed around the integrated circuit package system 100 and the mold compound 104 is forced into the mold. The mold is removed and the mold compound 104 fills the space between the substrate 102 and the heat slug 106 and encapsulates the dies 202, the wires 206 and the heat slug support pillars 200.

Figure 7:
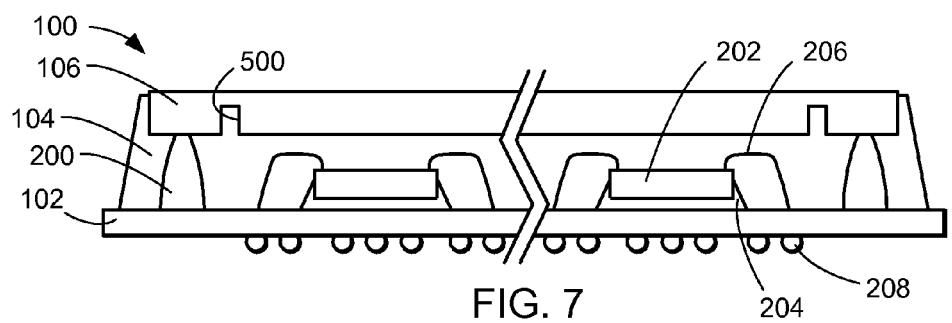
FIG. 7 shows the structure of FIG. 6 after attaching a ball grid array.

Referring now to FIG. 7, therein is shown the structure of FIG. 6 after attaching the ball grid array 208. The ball grid array 208 is at the bottom of the substrate 102 and is the electrical connection to printed circuit boards or other electrical systems.

Figure 8:
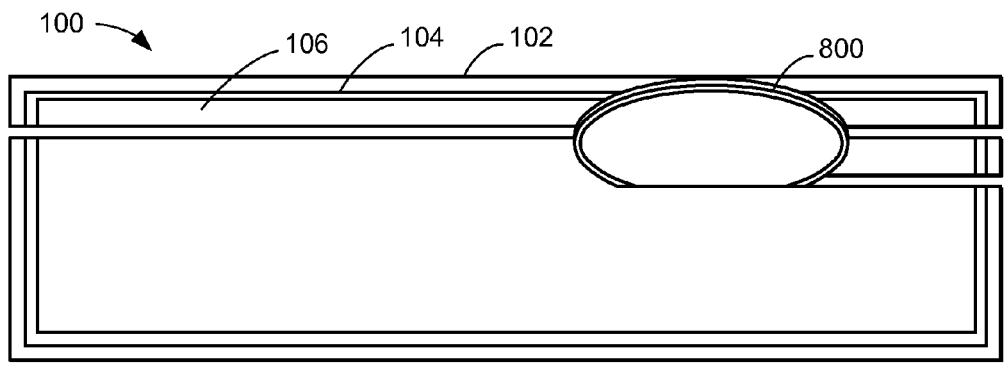
FIG. 8 shows the structure of FIG. 7 in a schematic view during singulation.

Referring now to FIG. 8, therein is shown the structure of FIG. 7 in a schematic view during singulation. In one embodiment, a singulation saw 800 is used to cut through the heat slug 106, the mold compound 104, and the substrate 102. Some of the saw cuts will be through the groove 500 of FIG. 5.

Referring now to FIG. 9, therein is shown a singulated integrated circuit package system 900. It should be noted that the heat slug support pillars 200 are eliminated during the singulation into the singulated integrated circuit package system 900.

Referring now to FIG. 10, therein is shown a flat heat slug 1000 in accordance with an embodiment of the present invention.

The flat heat slug 1000 can be easily used for chip-scale packages (CSP) as well as for ball grid array (BGA) packages. Moreover, the flat heat slug 1000 has more advantages when it is used for a CSP than a BGA. All singulated integrated circuit package systems of CSP using flat heat slugs 1000 do not need any additional area for heat slugs in comparison to a typical CSP. This is because heat slug support pillars 200 are eliminated during manufacturing. This invention provides the nomenclature of thermally-enhanced CSPs (TECSPs) for CSPs using flat heat slugs 1000.

Referring now to FIG. 11, therein is shown a cross-sectional view of FIG. 10 along line 11-11. The flat heat slug 1000 has a rectangular cross-section.

Referring now to FIG. 12, therein is shown a half-etched heat slug 1200 in another embodiment of the present invention. The half-etched recesses 1202 set off the individual heat slugs for the individual dies.

Referring now to FIG. 13, therein is shown the structure of FIG. 12 along line 13-13. The half-etched heat slug 1200 has the half-etched recesses 1202 separated by raised areas 1302. The half-etched recess 1202 provide pre-formed sawing lines for singulation similar to the groove 500 of FIG. 5. The pre-formed sawing lines reduce the stress in the flat-type TECSP and permit saw blade singulation.

Referring now to FIG. 14, therein is shown a tie bar heat slug 1400 in accordance a still further embodiment of the present invention. The heat slug is full-etched through in full-etched lines 1402 to leave individual heat slugs 1404 connected together by tie bars 1406.

While the structures of FIGS. 12 and 14 have four rows into which the systems will be singulated, various other arrays can be used.

Referring now to FIG. 15, therein is shown a cross-sectional view of the structure of FIG. 14 along line 15-15. The tie bar heat slug 1400 has the individual heat slugs 1404 with rectangular cross-sections. The pre-formed full-etched lines 1402 reduce the stress in the flat-type TECSP and permit rapid saw blade singulation by only requiring sawing through the tie bars 1406 of FIG. 14.

The heat slugs of FIGS. 10-14 are used with heat slug support pillars along the outside peripheries thereof so the pillars will be removed during singulation.

Referring now to FIG. 16, therein is shown a flow chart of an integrated circuit package system 1600 for manufacturing a package system 100 in accordance with a still further embodiment of the present invention. The system 1600 includes: performing back grinding on a wafer in a block 1602; mounting the wafer for sawing in a block 1604; die sawing in a block 1606; attaching the die and cure on a substrate in a block 1608; wire bonding the die to the substrate in a block 1610; forming pillars on the substrate in a block 1612; mounting a heat slug on the pillars in block 1614; encapsulating the die in an encapsulant on the substrate in a block 1616; curing the die in the encapsulant in a block 1618; mounting ball grid arrays to the substrate in a block 1620; ball mounting in a block 1622; and singulating the substrate, the die, and the heat slug into an integrated circuit package system in block 1624.

Figure 17:
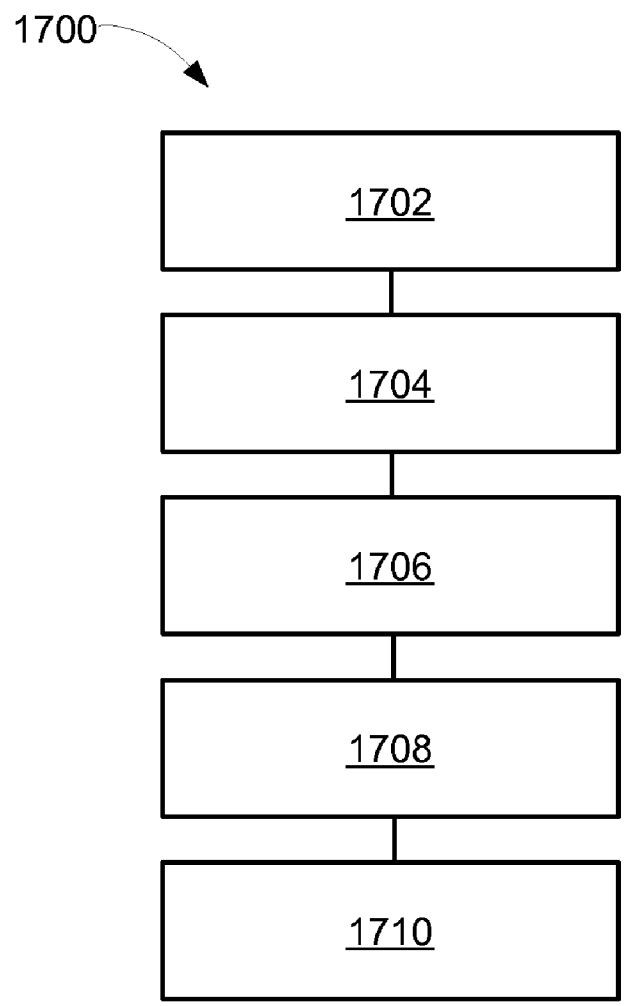
FIG. 17 shows a flow chart of an integrated circuit package system for manufacturing a package system in accordance with an even further embodiment of the present invention.

Referring now to FIG. 17, therein is shown a flow chart of an integrated circuit package system 1700 for manufacturing a package system 100 in accordance with a still further embodiment of the present invention. The system 1700 includes: providing a substrate having a die attached and electrically bonded thereto in a block 1702; forming heat slug pillars on the substrate in a block 1704; positioning a heat slug on the heat slug pillars in a block 1706; encapsulating the die and the heat slug pillars between the substrate and the heat slug in a mold compound in a block 1708; and singulating the substrate, the die, the heat slug, and the mold compound in a block 1710.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. An integrated circuit package system comprising:
   a substrate;
   a plurality of dies attached to the substrate and electrically bonded thereto;
   heat slug pillars on the substrate only around a periphery of the plurality of dies;
   a heat slug on the heat slug pillars; and
   a mold compound encapsulating the die and the heat slug pillars between the substrate and the heat slug wherein the die and the heat slug pillars are encapsulated in the mold compound for a package without the heat slug pillars.

2. The system as claimed in claim 1 wherein the heat slug includes indentations provided therein for heat dissipation thereby.

3. The system as claimed in claim 1 wherein the heat slug has a groove around the periphery thereof inside the heat slug pillars.

4. The system as claimed in claim 1 wherein the heat slug includes the heat slug with lines for individual heat slugs connected by tie bars.

5. The system as claimed in claim 1 further comprising:
   electrical bonds for electrically bonding dies to the substrate;
   pillars of adhesive for forming heat slug pillars around the periphery of the substrate;
   placing a heat slug on the pillars of adhesive; and
   solder balls on the substrate electrically connected to the dies.

6. The system as claimed in claim 5 wherein the heat slug is above the dies and electrical bonds.

7. The system as claimed in claim 5 wherein the heat slug has indentions provided therein.

8. The system as claimed in claim 5 wherein placing the heat slug includes a groove around the periphery thereof inside the heat slug pillars and out side the electrical bonds when positioned.

9. The system as claimed in claim 5 wherein the heat slug has full-etched lines for individual heat slugs connected by tie bars.

* * * * *

UNITED STATES PATENT AND TRADEMARK OFFICE
CERTIFICATE OF CORRECTION

PATENT NO. : 8,035,237 B2  
APPLICATION NO. : 12/398163  
DATED : October 11, 2011  
INVENTOR(S) : Lee et al.

Page 1 of 1

It is certified that error appears in the above-identified patent and that said Letters Patent is hereby corrected as shown below:

Column 2:
line 65, add double dashes between numbers 2-2 as follows: delete "along line 2-2;" and insert therefor --along line 2--2;--

Column 3:
line 15, add double dashes between numbers 11-11 as follows: delete "along line 11-11;" and insert therefor --along line 11--11;-- line 19, add double dashes between numbers 13-13 as follows: delete "along line 13-13;" and insert therefor --along line 13--13-- line 23, add double dashes between numbers 15-15 as follows: delete "along line 15-15;" and insert therefor --along line 15--15;-- line 63, add double dashes between numbers 2-2 as follows: delete "along line 2-2. The system" and insert therefor --along line 2--2. The system--

Column 5:
line 18, add double dashes between numbers 11-11 as follows: delete "line 11-11. The flat" and insert therefor --line 11--11. The flat-- line 36, delete "of FIGS. 12" and insert therefor --of FIGs. 12-- lines 40-41, add double dashes between numbers 15-15 as follows: delete "line 15-15. The tie bar" and insert therefor --line 15--15. The tie bar-- line 46, delete "of FIGS. 10-14" and insert therefor --of FIGs. 10-14--

Signed and Sealed this  
Third Day of April, 2012

David J. Kappos  
*Director of the United States Patent and Trademark Office*